(12) United States Patent
He et al.

(10) Patent No.: US 10,693,089 B2
(45) Date of Patent: Jun. 23, 2020

(54) FLEXIBLE DISPLAY DEVICE (71) Applicant: Shanghai Tianma Micro-Electronics Co., Ltd., Shanghai (CN)

(72) Inventors: Yongxin He, Shanghai (CN); Dong Chang, Shanghai (CN); Donghua Chen, Shanghai (CN); Zhenying Li, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/957,077

(22) Filed: Apr. 19, 2018

(65) Prior Publication Data
US 2019/0207130 A1 Jul. 4, 2019

(30) Foreign Application Priority Data
Dec. 29, 2017 (CN) .......................... 2017 1 1481259

(51) Int. Cl.
*H01L 51/00* (2006.01)
*H01L 51/52* (2006.01)
(Continued)

(52) U.S. Cl.
CPC ........ *H01L 51/0097* (2013.01); *H01L 51/003* (2013.01); *H01L 51/56* (2013.01);
(Continued)

(58) Field of Classification Search
CPC ............. H01L 51/0097; H01L 51/5253; H01L 2251/5338; H01L 27/3276
See application file for complete search history.

(56) References Cited

U.S. PATENT DOCUMENTS

2014/0240933 A1\* 8/2014 Lee .................. G06F 1/1652
361/749
2016/0181346 A1\* 6/2016 Kwon ................ H01L 27/3276
257/40
(Continued)

FOREIGN PATENT DOCUMENTS

| CN | 106449695 A | 2/2017 |
|---|---|---|
| CN | 107067978 A | 8/2017 |
| CN | 107146527 A | 9/2017 |

OTHER PUBLICATIONS

Chinese Office Action dated Dec. 18, 2019 for corresponding Chinese Patent Application No. 201711481259.2.

*Primary Examiner* — Mohammed Shamsuzzaman
*Assistant Examiner* — Aaron J Gray
(74) *Attorney, Agent, or Firm* — Tarolli, Sundheim, Covell & Tummino LLP (57) ABSTRACT

The present disclosure relates to a flexible display device, including a flexible substrate. The substrate includes a first portion, a second portion and a bending portion connecting the first portion to the second portion, wherein the flexible substrate has a thickness T. A plurality of display pixels is located at a side of the first portion of the flexible substrate. A supporting layer is located at a side of the flexible substrate facing away from the plurality of display pixels and includes a first supporting layer corresponding to the first portion and a second supporting area corresponding to the second portion. A thickness of the first supporting layer is T1, a thickness of the second supporting layer is T2, and a width of the bending portion is W, wherein $$W \geq (2T + T1 + T2)\frac{\pi}{2}.$$

(Continued)

Therefore, a narrow border is achieved, and the problem of interference during bending is alleviated.

7 Claims, 9 Drawing Sheets

(51) Int. Cl.
    *H01L 27/32*     (2006.01)
    *H01L 51/56*     (2006.01)

(52) U.S. Cl.
    CPC ...... *H01L 27/3276* (2013.01); *H01L 51/5253* (2013.01); *H01L 2227/323* (2013.01); *H01L 2227/326* (2013.01); *H01L 2251/5338* (2013.01); *H01L 2251/558* (2013.01)

(56) References Cited

U.S. PATENT DOCUMENTS

| | | | |
|---|---|---|---|
| 2016/0343964 A1* | 11/2016 | Kwon | H01L 51/56 |
| 2017/0371195 A1* | 12/2017 | Tomioka | H01L 51/5234 |
| 2018/0059728 A1* | 3/2018 | Kim | H01L 51/0097 |

* cited by examiner

FLEXIBLE DISPLAY DEVICE

CROSS-REFERENCE TO RELATED APPLICATIONS

The present application claims priority to Chinese Patent Application No. 201711481259.2, filed on Dec. 29, 2017, the content of which is incorporated herein by reference in its entirety.

TECHNICAL FIELD

The present disclosure relates to the field of display technologies and, in particular, to a flexible display device.

BACKGROUND

With the development of display technologies, the manufacturing technology for display devices is becoming more and more mature. Conventional display devices mainly include organic light emitting diode (OLED) display device, liquid crystal display (LCD) device, plasma display panel (PDP), etc. However, with the development of display technologies, people have higher and higher requirements regarding display performance on the display devices.

SUMMARY

In view of the above, the present disclosure provides a flexible display device, which achieves a narrow border by bending a second portion with respect to a first portion of the flexible substrate and thereby solving the problem of interference during bending.

The present disclosure provides a flexible display device including a flexible substrate. The flexible substrate comprises a first portion, a second portion, and a bending portion connecting the first portion to the second portion, wherein a thickness of the flexible substrate is T. The flexible display device further includes a plurality of display pixels located at a side of the first portion of the flexible substrate, and a supporting layer located at a side of the flexible substrate facing away from the plurality of display pixels. The supporting layer comprises a first supporting layer corresponding to the first portion and a second supporting layer corresponding to the second portion. A thickness of the first supporting layer is T1, a thickness of the second supporting layer is T2, and a width of the bending portion is W, wherein $$W \geq (2T + T1 + T2)\frac{\pi}{2}.$$

In the present disclosure, the bending portion is provided, so that the second portion is bent with respect to the first portion, thus the border of the non-display portion is reduced and a narrow border is achieved; in addition, since the width of the bending portion is $$W \geq (2T + T1 + T2)\frac{\pi}{2},$$

so that interference problem during bending will not occur, thereby the phenomenon of dark spot and cracking of film layer at the edge of the flexible display device is avoided.

DESCRIPTION OF EMBODIMENTS

In order to make the above objects, features and advantages of the present disclosure more understandable, the present disclosure will be illustrated in further detail with reference to the embodiments and the accompanying drawings. However, the embodiments may be implemented in various manners, which shall not be interpreted as being limited by the implementing manners illustrated herein. On the contrary, the implementing manners provided herein are intended to provide a more comprehensive and complete understanding, and deliver the whole concept of the embodiments to those skilled in the art. Same reference signs in the figures represent same or similar structures, thus the repetitive description thereof will be omitted. The terms representing location and orientation are described by taking the figures for example, which may be changed according to requirements, and the changes made also belong to the protection scope of the present disclosure. The figures of the present disclosure are only intended to show the relative position relation, the layer thicknesses of certain portions are shown in an exaggerated manner for a convenient understanding, thus the layer thicknesses in the figures do not represent the actual proportional relation of the layer thicknesses.

It should be noted that, specific details are illustrated as follows for a better understanding of the present disclosure. However, the present disclosure may be implemented in a variety of manners other than the manners described as below, those skilled in the art may generalize without departing from the concept of the present disclosure. Therefore the present disclosure will not be limited by the following disclosed specific implementing manners. Some terms are used in the specification and the claims for indicating specific assemblies. Those skilled in the art can understand, the hardware manufacturer may use different names for the same assembly. The specification and the claims distinguish the assemblies according to the difference in functions, rather than names. The term "include/comprise" used in the specification and claims is an open term, which shall be interpreted as "include/comprise but is not limited to . . . ". The specification shows preferred embodiments of the present disclosure, but the description thereof is aiming at providing a general principle of the present disclosure, rather than limiting the scope of the present disclosure. The protection scope of the present disclosure shall be defined by the appended claims.

Figure 1:
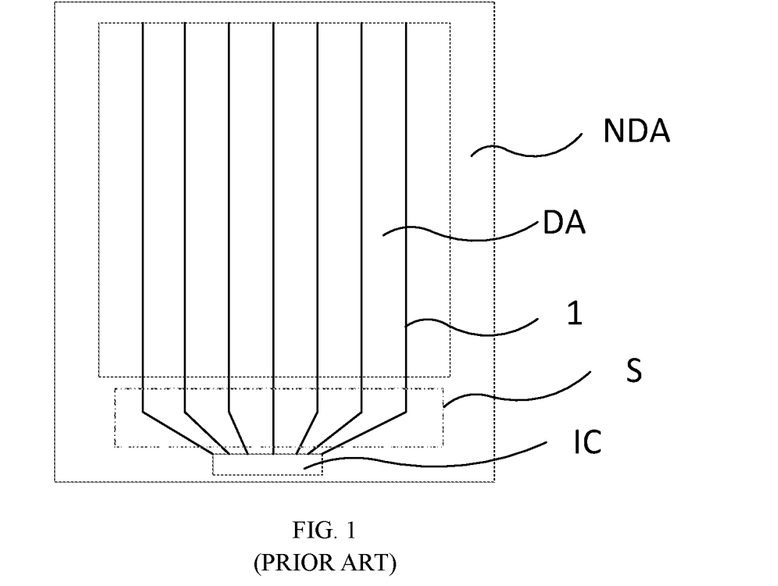
FIG. 1 is a structural schematic diagram showing a top view of a display device according to the related art.

As shown in FIG. 1, FIG. 1 is a structural schematic diagram showing a top view of a display device according to the related art. The display device includes a display area DA, a non-display area NDA surrounding the display area DA, and a driving integrated circuit IC arranged in the non-display area. The driving integrated circuit IC is electrically connected to a data line 1, for providing a signal to the data line. The data line 1 in the non-display area NDA needs to be bent and forms a fan-shaped wiring area 5. The presence of the fan-shaped wiring area 5 and the driving integrated circuit results in a wide border of the non-display area, which negatively affects a size of the display area, thus is adverse in achieving a narrow border.

Figure 2:
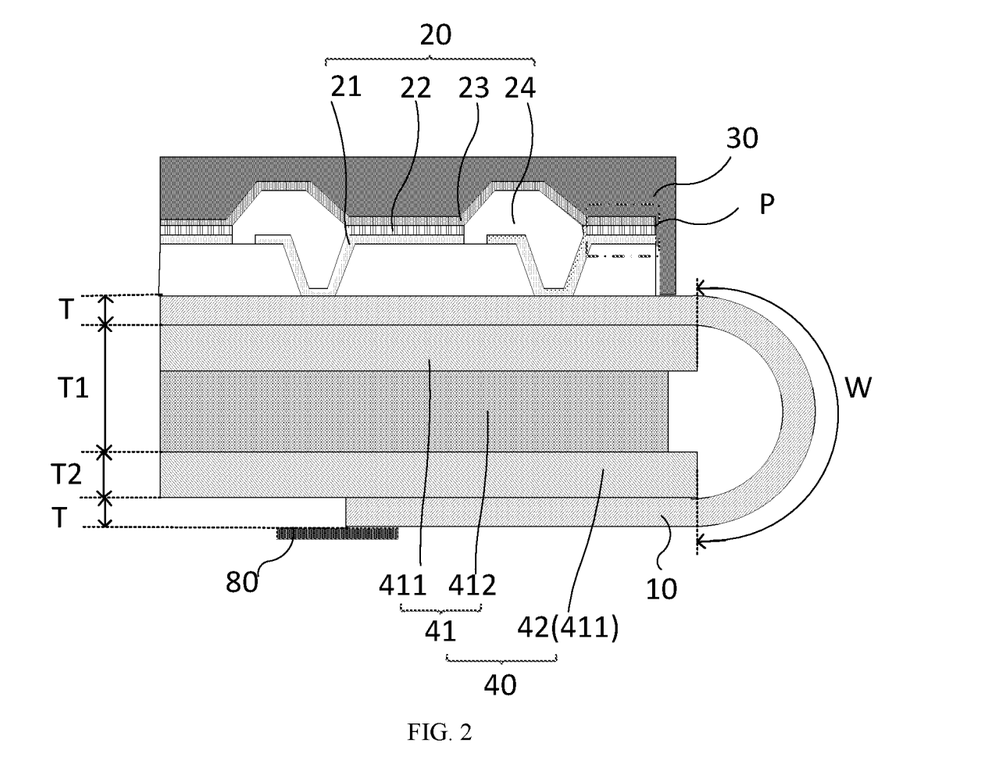
FIG. 2 is a structural schematic diagram showing a cross-section of a flexible display device in a bending state according to an embodiment of the present disclosure.
Figure 3:
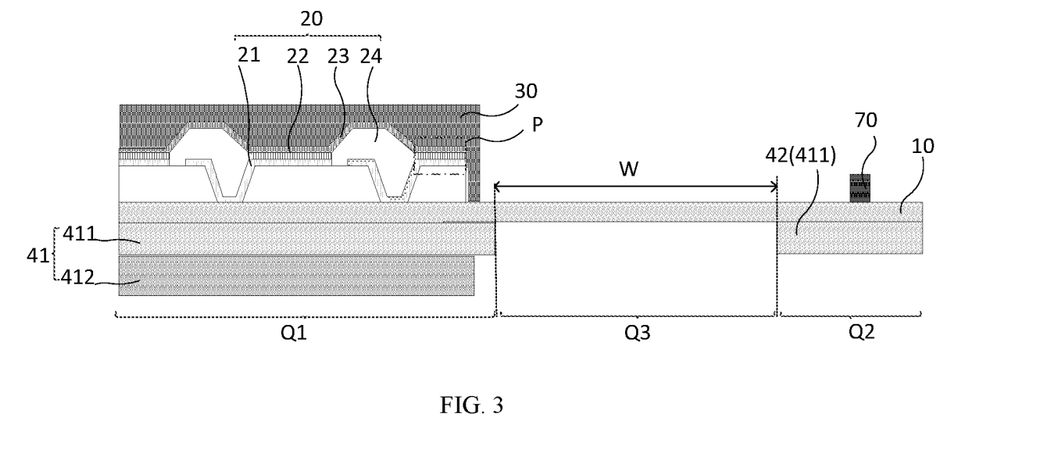
FIG. 3 is a structural schematic diagram showing a cross-section of a flexible display device in a non-bending state according to an embodiment of the present disclosure.

Please refer to FIGS. 2 and 3, where FIG. 2 is a structural schematic diagram showing a cross-section of a flexible display device in a bending state according to an embodiment of the present disclosure, and FIG. 3 is a structural schematic diagram showing a cross-section of the flexible display device in a non-bending state according to the embodiment of the present disclosure. According to the embodiment of the present disclosure, the flexible display device includes: a flexible substrate 10, a plurality of display pixels P, and a supporting layer 40. The flexible substrate 10 includes a first portion Q1, a second portion Q2 and a bending portion Q3 connecting the first portion Q1 to the second portion Q2. Further, a thickness of the flexible substrate 10 is T. The plurality of display pixels P is located on a side of the first portion Q1 of the flexible substrate 10. The supporting layer 40 is located at another side of the flexible substrate 10 facing away from the plurality of display pixels P. The supporting layer 40 includes a first supporting layer 41 corresponding to the first portion Q1 and a second supporting layer 42 corresponding to the second portion Q2. A thickness of the first supporting layer 41 is T1, a thickness of the second supporting layer 42 is T2, and a width of the bending portion is $$W \geq (2T+T1+T2)\frac{\pi}{2}.$$

In the present embodiment, on the one hand, the bending portion Q3 is provided between the first portion Q1 and the second portion Q2, so that the second portion Q2 is bent with respect to the first portion Q1, thus the border of the non-display area is narrowed and a narrow border is achieved; and on the other hand, since the thickness of the flexible substrate 10 is T, the thickness of the first supporting layer is T1, the thickness of the second support layer is T2, a bending radius is R=(2T+T1+T2), and the width of the bending portion is $$W \geq (2T+T1+T2)\frac{\pi}{2},$$

the width W of the bending portion Q3 is greater than or equal to a half of a circumference of a circle having a radius equal to the bending radius R, thus there is a certain distance between the plurality of display pixels P and the bending portion, therefore the phenomenon of dark spot at the display pixels P, which is caused by cracking at the bending interface during bending and water/oxygen seeping into the display device from the cracking area, is avoided. Moreover, during bending, the supporting layer 40 is located at an inner side of the bending arc, and the width of the bending portion Q3 is $$W \geq (2T+T1+T2)\frac{\pi}{2},$$

which can further prevent interference by the supporting layer 40 to the bending action, namely, prevent the supporting layer 40 from hindering the bending action during bending. Else if the bending action is hindered by the supporting layer 40, the film layer of the bending portion will be subjected to a large stress due to the interference from the supporting layer, for example, if signal lines are provided in the bending portion, the signal lines may be subjected to a large stress, causing breakage of the signal lines, thereby affecting signal transmission.

Optionally, the width of the bending portion is $$W \geq (2T+T1+T2)\frac{\pi+2}{2}.$$

Under such setting, the bending of the bending portion can be operated smoothly without interference from the supporting layer or breakage of the signal lines. The present disclosure has no particular limit to the upper limit of the width of the bending portion as long as the flexible display device is applicable. Based on a setting that the bending radius is 3 mm, tests on the bending times are conducted under the following three conditions (W is the width of the bending portion):

$$\text{Condition 1: } W < (2T + T1 + T2)\frac{\pi}{2};$$

$$\text{Condition 2: } (2T + T1 + T2)\frac{\pi}{2} \le W < (2T + T1 + T2)\frac{\pi + 2}{2};$$

$$\text{Condition 3: } W \ge (2T + T1 + T2)\frac{\pi + 2}{2};$$

On the basis of the above three conditions, a bending test is conducted on 20 flexible display devices and each is tested for 100 thousands of times, and the test results are listed in Table 1.

TABLE 1

Test results of bending test for 100 thousands of times under different conditions

| Test conditions | whether the film layer peeled or not | whether lines broke or not | whether dark spot is present or not | Abnormal probability |
|---|---|---|---|---|
| Condition 1 | yes | yes | yes | 17/20 |
| Condition 2 | no | no | yes | 2/20 |
| Condition 3 | no | no | no | 0 |

From the above test results, it can be seen that, if the width of the bending portion is set as $$W \ge (2T + T1 + T2)\frac{\pi}{2},$$

it will alleviate the dark spot caused by the bending action and the problem of peeling off of the film layer or line breakage caused by the interference of the supporting layer 40 to the bending action, or even eliminate the above problems by setting the width of the bending portion as $$W \ge (2T + T1 + T2)\frac{\pi + 2}{2}.$$

In an embodiment, as shown in FIG. 2, the flexible display device further includes an organic light-emitting device layer 20 and an encapsulation layer 30 provided on the flexible substrate 10 in a direction away from the supporting layer 40. The plurality of display pixels P is arranged in the organic light-emitting device layer 20. Optionally, the organic light-emitting device layer 20 includes a first electrode 21, a second electrode 23, a light-emitting layer 22 provided between the first electrode 21 and the second electrode 23, and a pixel defining layer 24 which separates the light-emitting layer 22 to form the plurality of display pixels P. The first electrode 21 can be an anode and the second electrode 23 can be a cathode. Alternatively, the first electrode 21 can be a cathode and the second electrode 23 can be an anode. The pixel defining layer 24 can include polyacrylic resin, polyimide resin, or an inorganic material such as silica. The organic light-emitting device layer 20 can further includes one or more of a hole injection layer, a hole transmission layer, an electron blocking layer, a hole blocking layer, an electron transmission layer, or an electron injection layer. The hole injection layer and/or the hole transmission layer can be arranged between the anode and a light-emitting pixel layer. The electron injection layer and/or the electron transmission layer can be arranged between the cathode and the light-emitting pixel layer. The hole injection layer, the hole transmission layer, the electron transmission layer and the electron injection layer can be formed on the whole display portion of the flexible substrate 10. It should be noted that, in a case in which the first electrode 21 is an anode and the second electrode 23 is a cathode, the anode can includes a structure of indium tin oxide-Ag-indium tin oxide (i.e., ITO-Ag-ITO), and the anode can effectively reflect the light emitted by the light-emitting pixel layer 22 to a light emergent side, which can improve light extraction efficiency, since the holes injected from the anode and the electrons injected from the cathode combine to generate excitons in the light-emitting pixel layer and the exciton changes from the excited state to a ground state, so as to generate light.

Optionally, the organic light-emitting device layer 20 can be sealed by the encapsulation layer 30. The encapsulation layer 30 can includes at least one organic encapsulation layer and at least one inorganic encapsulation layer. The material of the organic encapsulation layer can include polymers, for example, the organic encapsulation layer is the a single layer or a stacked layer formed by one or more polymers, for example, polyethylene terephthalate, polyimide, polycarbonate, epoxy resin, polyethylene, polyacrylate, organosiloxane and the like. The inorganic encapsulation layer can be a single layer or a stacked layer containing one or more of a metallic oxide, a non-metallic oxide or a nitride. For example, the inorganic encapsulation layer can include $SiN_x$, $Al_2O_3$, $SiO_2$, $SiO_xN_y$, $TiO_2$, or any combination thereof. It should be noted that, the present disclosure does not limit the specific material and structure of the encapsulation layer 30.

In an embodiment, again with reference to FIG. 2, the first supporting layer 41 includes a protection layer 411 and an auxiliary component 412 arranged in a direction in which the flexible substrate 10 faces away from the plurality of display pixels P, and in the same direction, the second supporting layer 42 includes a protection layer 411. The protection layer 411 can improve the rigidity or sturdiness of the flexible display device, and the protection layer 411 may not be arranged on a side of the bending portion Q3, so as to improve the bending performance of the bending portion Q3. The protection layer 411 can be formed by a plastic film made of polyimide, poly(ethylene naphthalate), polyethyleneterephthalate, any other suitable polymer, or any combination thereof. Alternatively, the protection layer can also formed by a thin glass, a metal foil covered by a dielectric material, a multi-layer polymer stack or a composite polymer film of a polymer material to which nanoparticles or microparticles dispersed therein are bonded, etc. The protection layer 411 used in different portions of the flexible display device may be made of different materials. For example, the protection layer 411 of the first supporting layer 41 can be made of a thin glass layer or an organic substance having a relative high rigidity; the protection layer 411 of the bending portion or the second supporting layer 42 can have a small rigidity but a high flexibility, so as to guarantee the rigidity of the flexible display device and, at the same time, improve the anti-impact performance of the flexible display device, thereby preventing the flexible substrate from being damaged by external force, and improving the bending performance of the bending portion Q3.

During a manufacturing process of the flexible display device, a portion of the flexible display device can be exposed to external light. When manufacturing the flexible display device, for example, when peeling off the flexible substrate from the platform deck by laser, a threshold voltage of a thin film transistor (not shown) on the flexible substrate 10 may deviate due to laser irradiation. Additionally, some portions of the flexible display device may be exposed to much more external light than other portions, which may cause non-uniform display problems such as non-uniform brightness and shadows. In order to solve the above problems, the protection layer 411 in the present disclosure can be made of a material having a certain light blocking, light absorbing or reflection function. For example, a carbon black modified by chloride may be mixed within the composition material (e.g., polyimide or other polymers) of the protection layer 411. Therefore, the protection layer 411 has light blocking function. The protection layer 411 can further include a light blocking material which can reduce the amount of light entering into the flexible display device from a side away from the Light output side The auxiliary component 412 mainly functions to fit the bending radius, so that the second portion Q2 is bent to a back-light side of the first portion Q1 under a predetermined bending radius, therefore, it is possible to adjust the bending radius by adjusting the thickness of the auxiliary component 412. Additionally, the auxiliary component 412 can further improve the rigidity of the flexible display device, so as to prevent damage to the flexible display device caused by external force.

Optionally, the auxiliary layer 412 can be formed by a plastic material such as polycarbonate, polyimide, poly (ethylene naphthalate), polyethyleneterephthalate, any other suitable polymer, or any combination thereof. The rigidity of the auxiliary component 412 formed by such a plastic material can be controlled by controlling a thickness of the auxiliary component and/or by providing an additive used for improving rigidity. Additionally, the auxiliary component 412 can also be made of glass, ceramic, metal, other rigid material, or any combination thereof.

Figure 4:
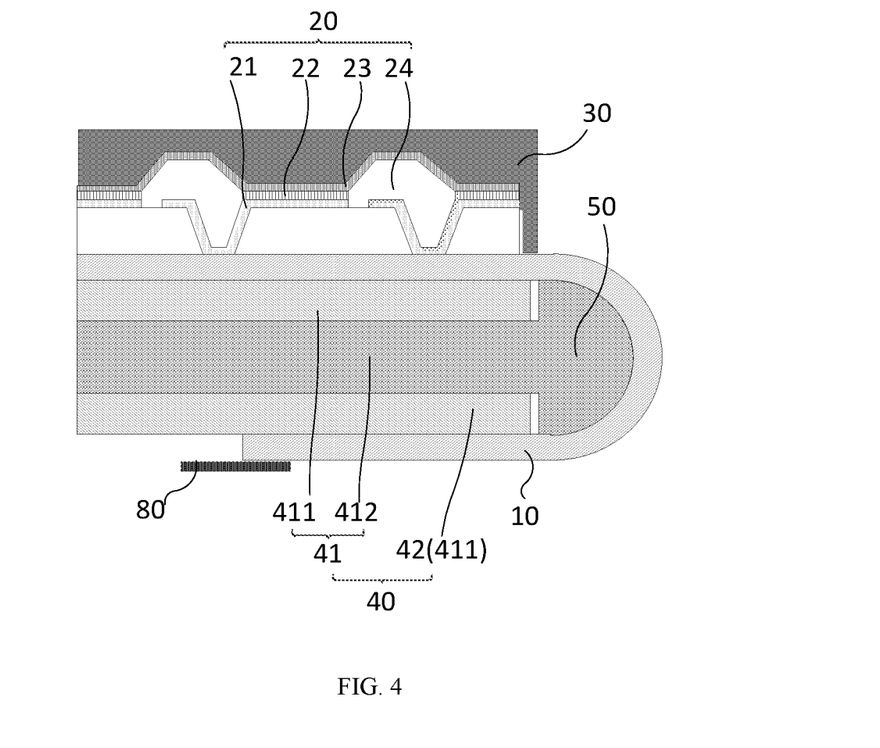
FIG. 4 is a structural schematic diagram showing a cross-section of another flexible display device in a bending state according to an embodiment of the present disclosure.
Figure 5:
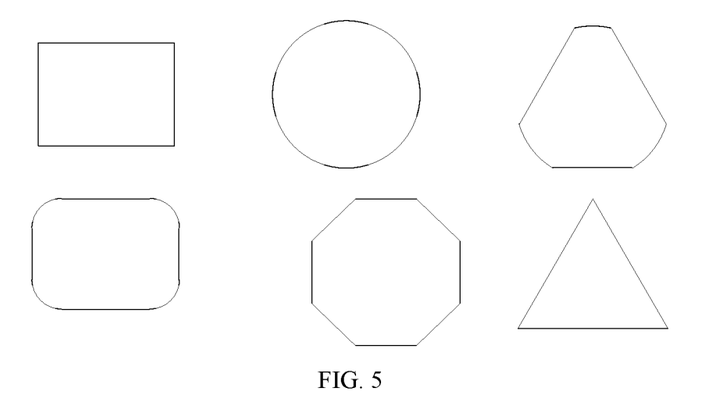
FIG. 5 is a structural schematic diagram showing a cross-section of a support member according to an embodiment of the present disclosure.

FIG. 4 is a structural schematic diagram showing a cross-section of another flexible display device in a bending state according to an embodiment of the present disclosure and FIG. 5 is a structural schematic diagram showing a cross-section of a support member according to an embodiment of the present disclosure. Optionally, as shown in FIG. 4 and FIG. 5, the flexible display device includes a support member 50 corresponding to the bending portion Q3. As shown in FIG. 5, the shape of the cross-section of the support member 50 can be any one of the following shapes: circle, rectangle, arc, arc rectangle, semi-circle, triangle, polygon, arc polygon and ellipse. Optionally, the support member and the auxiliary component 412 are formed integrally. For example, in FIG. 4, the shape of cross-section of the support member is a semi-circle, and the support member 50 and the auxiliary component are formed integrally. The support member 50 is used to define the bending radius, so that when bending, the bending portion Q3 is bent along a surface of the support member 50, thereby preventing other layers corresponding to the bending portion from rupturing or being damaged due to an excessive bending. Optionally, the support member 50 and the auxiliary component are formed integrally, so as to avoid a bending deviation caused by an alignment deviation between the auxiliary component 412 and the support member 50 during the bending action, so that the width of the bending portion is more accurately controlled for a better bending, thus the dark spot or interference due to bending of the bending portion will not occur.

Optionally, as shown in FIG. 4, the thickness of the auxiliary component 412 can be smaller than the diameter of the support member 50, the auxiliary component 412 in FIG. 4 is level with neither the top nor the bottom of the support member 50, so that the second supporting layer 42 can compensate a height difference between the auxiliary component 412 and the support member 50 after bending, thus the bending portion can be better bent along the surface of the support member 50.

Figure 6:
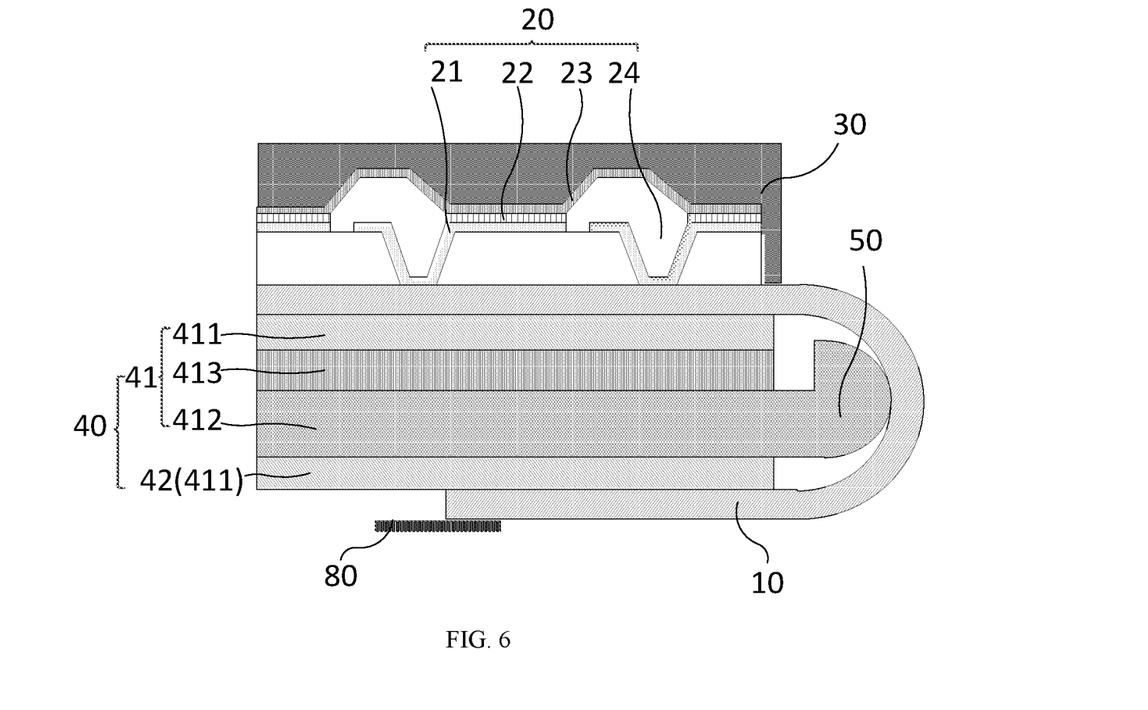
FIG. 6 is a structural schematic diagram showing a cross-section of still another flexible display device in a bending state according to an embodiment of the present disclosure.

FIG. 6 is a structural schematic diagram showing a cross-section of still another flexible display device in a bending state according to an embodiment of the present disclosure. Optionally, as shown in FIG. 6 the thickness of the auxiliary component 412 is smaller than the diameter of the support member 50. The present embodiment differs from the above embodiments in that the support member 50 in FIG. 6 is tangent to the bottom of the auxiliary component 412, so as to provide an auxiliary component 412 having a flat bottom surface, so that after bending, the second portion can be excellently fixed on a side of the auxiliary component 412 facing away from the plurality of display pixels P.

Figure 7:
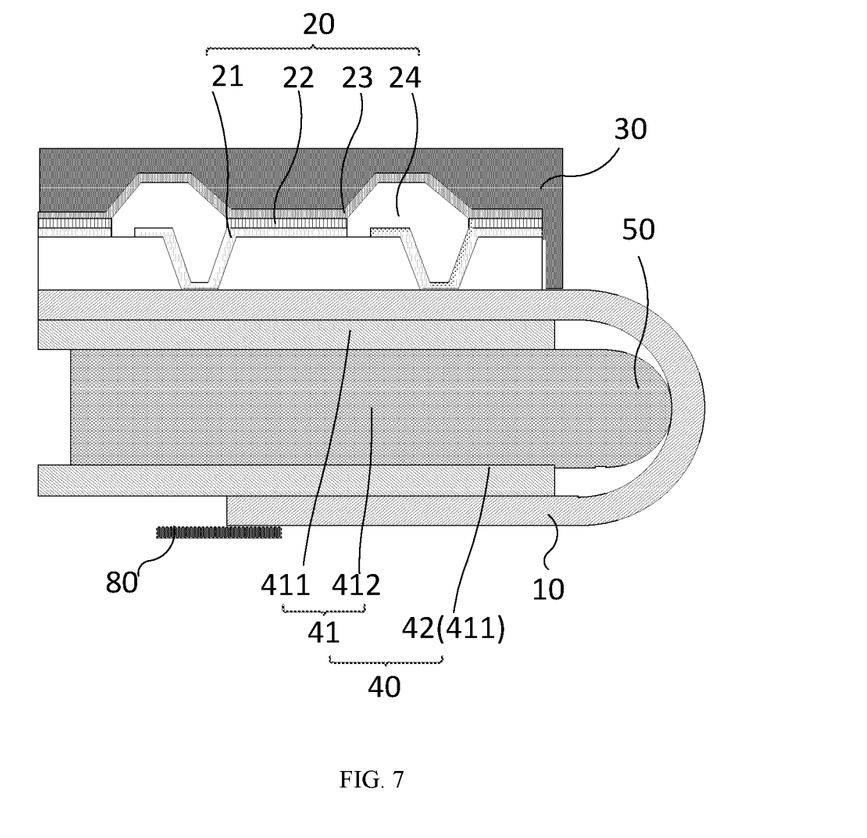
FIG. 7 is a structural schematic diagram showing a cross-section of still another flexible display device in a bending state according to an embodiment of the present disclosure.

Optionally, as shown in FIG. 7, FIG. 7 is a structural schematic diagram showing a cross-section of still another flexible display device in a bending state according to an embodiment of the present disclosure. The embodiment shown in FIG. 7 differs from the above embodiment in that the thickness of the auxiliary component 412 is substantially equal to the diameter of the support member 50, so that when bending, the bending portion Q3 is bent along the semicircular surface of the support member 50, and the protection layers is located at two sides of the auxiliary component, without the need of any alignment.

Figure 8:
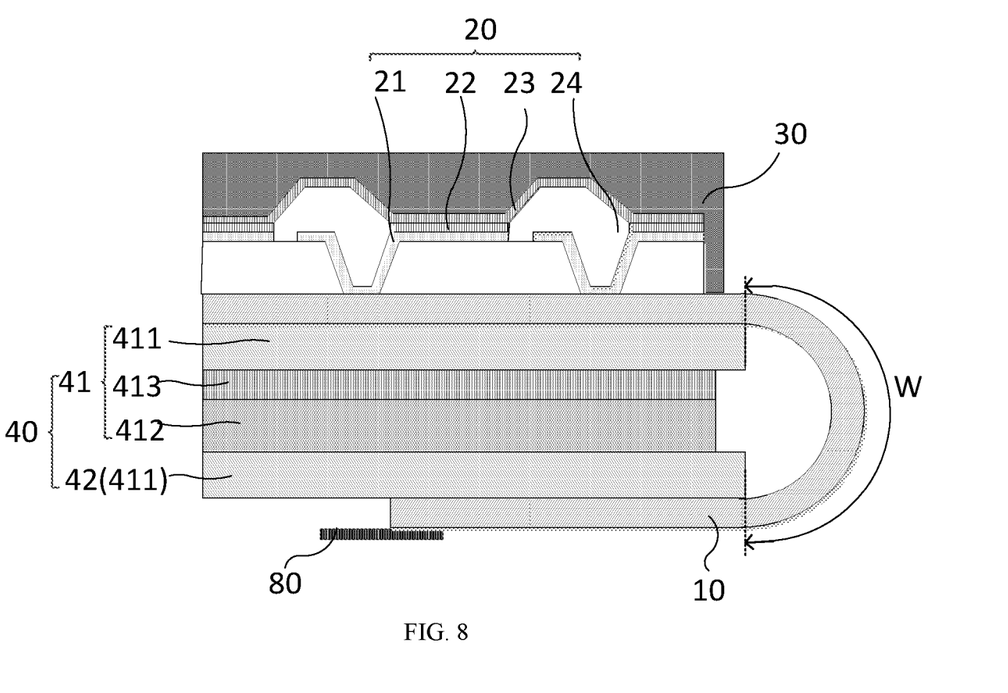
FIG. 8 is a structural schematic diagram showing a cross-section of still another flexible display device in a bending state according to an embodiment of the present disclosure.

FIG. 8 is a structural schematic diagram showing a cross-section of still another flexible display device in a bending state according to an embodiment of the present disclosure. Optionally, as shown in FIG. 8, the first supporting layer 41 further includes a composite material layer 413, and the composite material layer 413 is provided between the protection layer 411 and the auxiliary component 412. For example, the composite material layer can be a heat dissipation layer, an anti-static layer, or a combination thereof, which can improve heat dissipation effect and/or electrostatic dissipation effect of the flexible display device.

Figure 9:
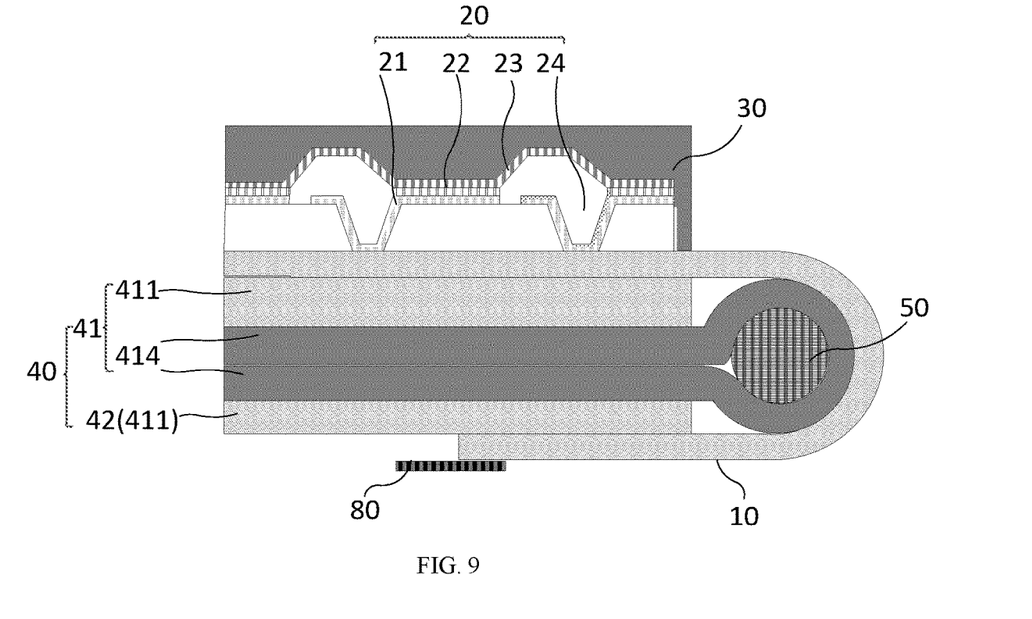
FIG. 9 is a structural schematic diagram showing a cross-section of still another flexible display device in a bending state according to an embodiment of the present disclosure.
Figure 10:
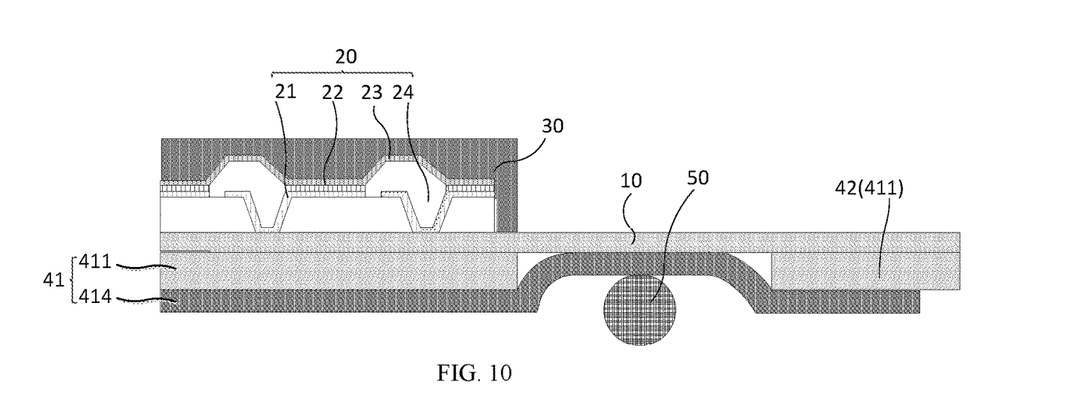
FIG. 10 is a structural schematic diagram showing a cross-section of another flexible display device in a non-bending state according to an embodiment of the present disclosure.

Optionally, please refer to FIG. 9 and FIG. 10, where FIG. 9 is a structural schematic diagram showing a cross-section of still another flexible display device in a bending state according to an embodiment of the present disclosure and FIG. 10 is a structural schematic diagram showing a cross-section of another flexible display device in a non-bending state according to an embodiment of the present disclosure. It differs from the above embodiments in that the first supporting layer 41 includes a protection layer 411 and a portion of a buffer component 414 arranged in this order in a direction in which the flexible substrate 10 faces away from the plurality of display pixels P, and in the same direction, the second supporting layer 42 includes a protection layer 411. Optionally, the flexible display panel includes a support member 50 at a side of the bending portion Q3, and the second supporting layer 42 further includes another portion of the buffer component 414 at a side of the protection layer 411 facing away from the flexible substrate 10, so that when bending, the buffer component 414 wraps the support member 50.

Figure 11:
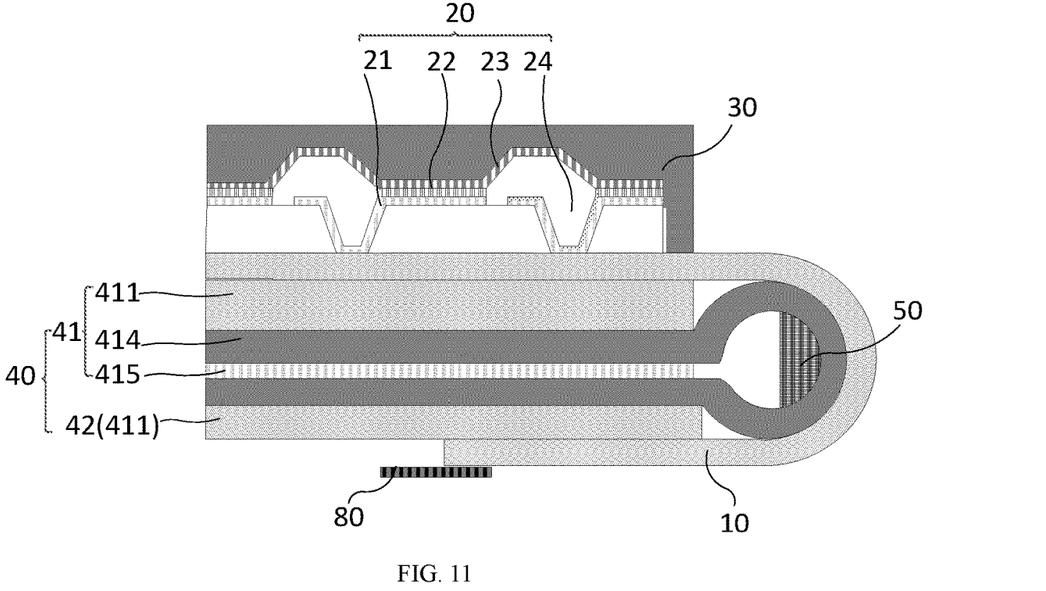
FIG. 11 is a structural schematic diagram showing a cross-section of still another flexible display device in a bending state according to an embodiment of the present disclosure.

Optionally, the material of the buffer component 411 can be foam, rubber material and the like having a relative small modulus of elasticity. In the present embodiment, since the buffer component wraps the support member, due to the small modulus of elasticity of the buffer component, the buffer components 411 can define the bending radius when bending, thereby bending the bending portion Q3 along a predetermined bending radius, while further preventing the interference by the supporting layer during bending action. Optionally, it can be set that the buffer component 414 in the bending portion Q3 has a modulus of elasticity less than a modulus of elasticity of either the first portion Q1 or the second portion Q2, thus not only the bending radius is defined and the interference is avoided, but also the rigidity of the flexible display device is guaranteed, thereby improving the anti-impact performance of the flexible display device. The shape of the cross-section of the support member in FIG. 9 is a circle, while in other embodiments, the shape thereof can also be a semi-circle, as shown in FIG. 11, where FIG. 11 is a structural schematic diagram showing a cross-section of still another flexible display device in a bending state according to an embodiment of the present disclosure. In other embodiments, the shape of the cross-section of the support member 50 can be any one of the following shapes: rectangle, arc, arc rectangle, semi-circle, triangle, polygon, arc polygon and ellipse, which is not limited in the present disclosure, as long as the buffer component 411 is capable of wrapping the support member.

Figure 12:
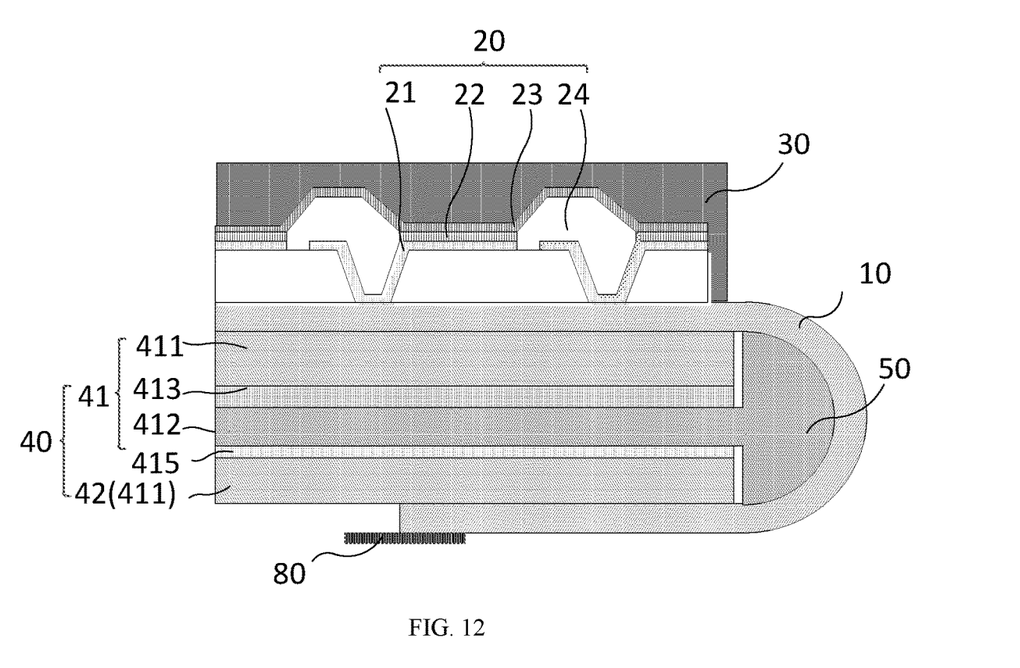
FIG. 12 is a structural schematic diagram showing a cross-section of still another flexible display device in a bending state according to an embodiment of the present disclosure.

Please refer to FIG. 11 and FIG. 12, where FIG. 12 is a structural schematic diagram showing a cross-section of still another flexible display device in a bending state according to an embodiment of the present disclosure. It differs from the above embodiments in that the first supporting layer 41 further includes an adhering layer 415 arranged at a side of the auxiliary component 412 facing away from the flexible substrate 10, and the second portion Q2 is adhered to the first portion Q1 by the adhering layer, so that the second portion Q2 is fixed on the back-light side of the display device. The adhering layer 415 can include any suitable adhesive material such as force sensitive adhesive, foam adhesive, liquid adhesive, light-cured adhesive and so on. In some embodiments, the adhering layer 415 can be formed by a compressible material or otherwise include a compressible material, and is used as a gasket for the component to be adhered by the adhering layer. For example, one of the materials of the adhering layer 415 is compressible. The adhering layer 415 can be formed by multiple layers, including a gasket layer inserted between an upper layer and a lower layer of the adhesive material, such as polyolefin foam. Therefore, when the second portion is bent to a side of the first portion facing away from the flexible substrate, the difference caused by alignment can be compensated. Taking FIG. 4 as an example, since the thickness of the auxiliary component 412 is smaller than the diameter of the support member 50, and the auxiliary component 412 is level with neither the top nor the bottom of the support member, when bending, the second supporting layer 42, i.e., the protection layer 411 in FIG. 4, compensates the height difference between the auxiliary component 412 and the support member 50, so that the bending portion Q3 can be bent along the surface of the support member 50. However, the thickness of the auxiliary component 412 may be greater or smaller than this height difference, if an adhering layer is provided at a side of the auxiliary component 412 of the first supporting layer 41 facing away from the flexible substrate and the adhering layer is compressible, then the height difference between the support member 50 and the clamping portion 50 can be excellently compensated, so that the second supporting layer 42 and the auxiliary component 412 can be excellently aligned after bending. It should be noted that, the adhering layer 415 can also be arranged on an upper surface of the auxiliary component 412. In some other embodiments, the first supporting layer further includes an adhering layer 415 arranged at a side of the buffer component 414 facing away from the flexible substrate 10, and the second portion Q2 is adhered to the first portion Q1 by the adhering layer, or the adhering layer 415 is arranged at two sides of the buffer component 414.

Figure 13:
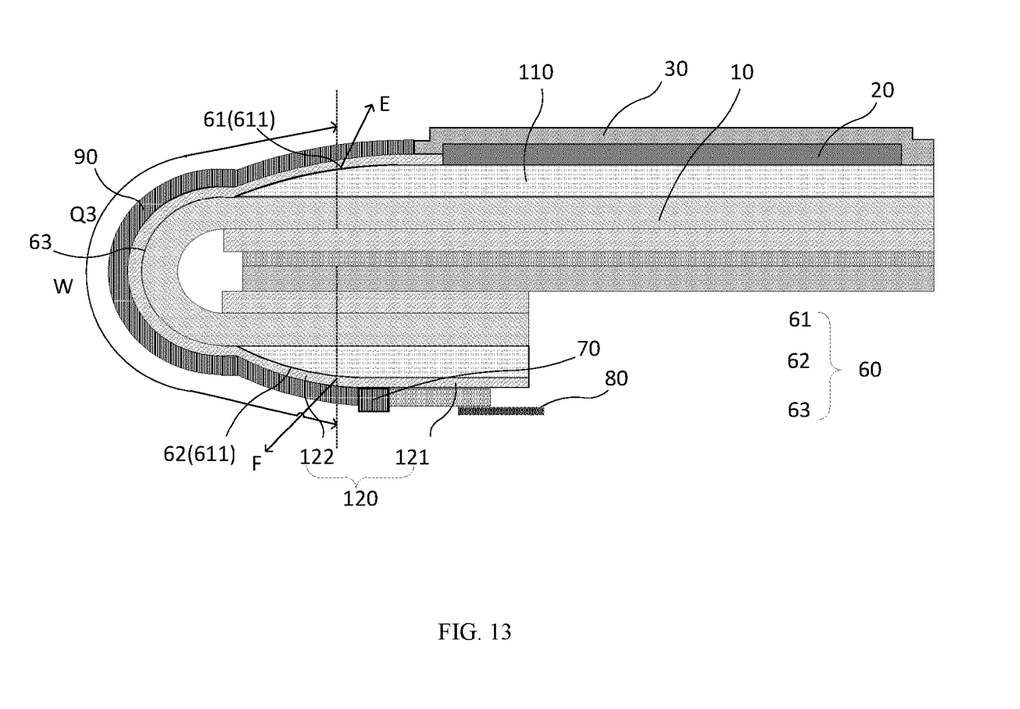
FIG. 13 is a structural schematic diagram showing a cross-section of still another flexible display device in a bending state according to an embodiment of the present disclosure.

Optionally, as shown in FIG. 13, FIG. 13 is a structural schematic diagram showing a cross-section of still another flexible display device in a bending state according to an embodiment of the present disclosure. It differs from the above embodiments in that an insulation layer 110 and a plurality of wirings 120 are further included. The insulation layer 110 is formed between the flexible substrate 10 and the plurality of display pixels. The insulation layer 110 includes at least one notch 60 corresponding to the bending portion Q3. Wrings 120 of the plurality of wirings 120 corresponding to the bending portion Q3 are arranged along a shape of a surface of the insulation layer 110 corresponding to the bending portion Q3. The notch 60 includes an inclined side wall 611, and the inclined side wall 611 has a convex shape facing away from the flexible substrate 10. In the present embodiment, at least one notch 60 is arranged in the insulation layer 110 corresponding to the bending portion, on the one hand, this can effectively reduce a thickness of insulation layer corresponding to the bending portion, so as to effectively reduce the bending stress of the insulation layer 110, and prevent cracks on the insulation layer 110 during bending; and on the other hand, since the notch 60 includes an inclined side wall 611 having a convex shape facing away from the flexible substrate 10, the plurality of wirings 120 at the notch can be arranged along the convex shape of the inclined side wall 611, so as to prevent the plurality of wirings from climbing a steep slope that may lead to short circuit or open circuit of the wirings 120. It should be noted that, the steep slope in the present embodiment refers to a slope in which an included angle between a tangent line of an endpoint of the notch 60 close to the flat portion A and a plane in which the flexible substrate 10 is located is smaller than or equal to 40°. Therefore, it is possible to effectively reduce the bending stress of the insulation layer, and short circuit or open circuit of the wirings is prevented when the wirings are arranged on the surface of the insulation layer. Additionally, in the preset embodiment, the width of the bending portion is set as $$W \geq (2T + T1 + T2)\frac{\pi}{2},$$

so that the notch 60 can have a longer inclined side wall 611, and the inclined side wall can have a more gentle slope, and thus the wirings 120 will not break due to climbing a steep slope when being formed on the surface of the insulation layer. Additionally, this also brings a better connection between the inclined side wall 611 and a bottom surface 63, preventing short circuit of the wirings 120 at the bottom surface 63. The insulation layer 110 includes at least one inorganic layer stacked up on the flexible substrate 10, and the at least one notch 60 is arranged in at least one outermost layer of the at least one inorganic layer.

Optionally, the flexible display device can further include a thin film transistor (not shown), a plurality of data lines and a plurality of scan lines (not shown), for achieving display. The thin film transistor at least includes an active layer, a source electrode, a drain electrode, a gate insulation layer, a gate electrode, and an interlayer insulation layer. The drain electrode of the thin film transistor can be electrically connected to the anode. The plurality of data lines and the plurality of scan lines intersect with each other. The data lines are electrically connected to the source electrode of the thin film transistor, and the scan lines are electrically connected to the gate electrode of the thin film transistor. When working, the scan lines control the plurality of sub-pixels to be on or off by the gate electrode of the thin film transistor, and the data lines are electrically connected to the anode by the source electrode of the thin film transistor, for providing data signals to the sub-pixels when the thin film transistor corresponding to each sub-pixel is turned on, thereby controlling display of the sub-pixels. The specific structure of the thin film transistor can adopt the conventional technique, which will not be described herein.

Optionally, the insulation layer 110 can include at least one of a gate insulation layer (not shown) and an interlayer insulation layer (not shown). Optionally, when the buffer layer or the blocking layer is provided on the flexible substrate, the insulation layer 110 can include at least one of the blocking layer and the buffer layer.

Figure 14:
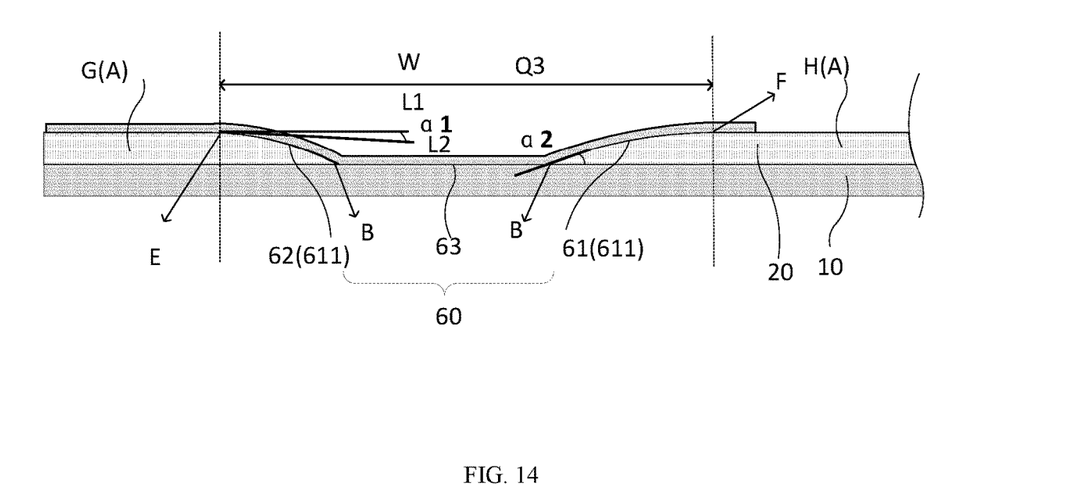
FIG. 14 is a structural schematic diagram showing a cross-section of a bending portion Q3 according to an embodiment of the present disclosure.

It should be noted that, the remaining portion of the insulation layer 110 rather than the notch 60 may be a flat portion, the flat portion can allow processing errors, that is, the flat portion is not absolutely flat in geometry. For the convex shape of the inclined side wall 611 facing away from the flexible substrate 10, please refer to FIG. 14, where FIG. 14 is a structural schematic diagram showing a cross-section of a bending portion Q3 according to an embodiment of the present disclosure (schematically, the cross-sectional view in FIG. 14 only shows partial film layers). The inclined side wall 611 has two endpoints close to the flat portion A, i.e., endpoint E and endpoint F. Taking endpoint E as an example, a tangent line L1 at endpoint E divides the cross-section into two sides, and the inclined side wall 62 where endpoint E is located and the flat portion G connected to the inclined side wall 62 are located at a same side of the tangent line. An included angle formed between a tangent line at any point of the inclined side wall 611 and the plane in which the flexible substrate is located is less than 45°, so that the insulation layer 20 transitions from the flat portion to the bottom of the notch 60 with a gentle slope, thereby preventing short circuit or open circuit of the wirings. In the present embodiment, the inclined side wall 611 has a convex shape facing away from the flexible substrate 10, which can effectively prevent line breakage due to large height difference or sharp corner when the wirings are entering into the notch from the flat portion.

Optionally, a passivation layer 90 is provided to be corresponding to the bending portion Q3 and the second portion Q2. The insulation layer 110 and the plurality of wirings 120 are covered by the passivation layer 90. The passivation layer 90 can be an organic layer. In this way, the plurality of wirings 120 can be protected by the passivation layer 90, which can prevent corrosion by external air and oxygen, and thus guarantee signal transmission. The passivation layer 90 adopts an organic layer, which can improve bending performance of the bending portion, and prevents peeling between the wirings 120 and the passivation layer 90.

Figure 15:
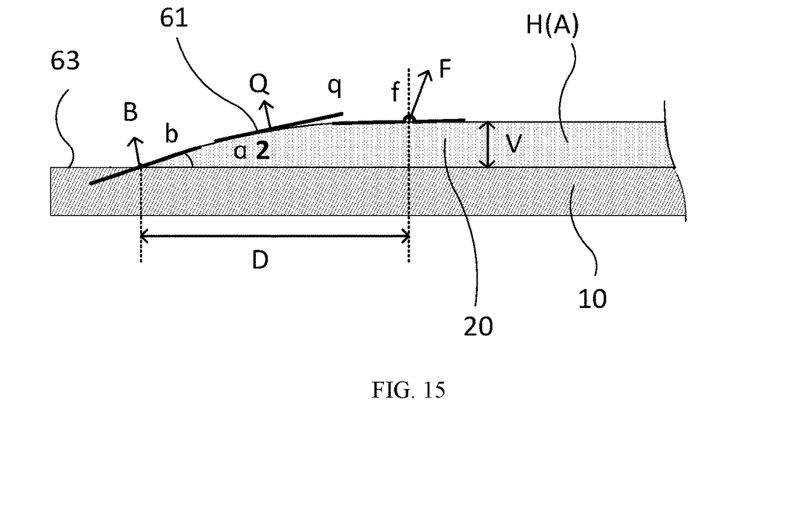
FIG. 15 is an enlarged view of an inclined side wall 61 in FIG. 14.

Optionally, the tangent line at any point on the inclined side wall 611 divides the plane into two sides, the inclined side wall where the tangent point of the tangent line is located is at a same side of the tangent line. Please refer to FIG. 15, where FIG. 15 is an enlarged view of the inclined side wall 611 in FIG. 14. For example, in FIG. 15, the endpoint F close to the flat portion H, the endpoint B away from the flat portion H and the point Q between the endpoint B and the endpoint F of the inclined side wall 61 are taken as an example. The tangent line at endpoint B is tangent line b, the tangent line at endpoint F is tangent line f, and the tangent line at point Q is tangent line q. In FIG. 15, it can be seen that the inclined side wall 61 is located at the same side of the tangent line B, the tangent line q and the tangent line f, respectively. The inclined side wall 61 in the present embodiment does not have a sharp corner, which will not lead to line breakage, and there is no vertical side wall either, thus the adjacent wirings 120 will not suffer short circuit at the bottom of the notch 60. Moreover, the passivation layer 90 can be excellently adhered onto the surface of the wirings 120, and during bending, the passivation layer 90 will not be peeled from the wirings 120.

Figure 16:
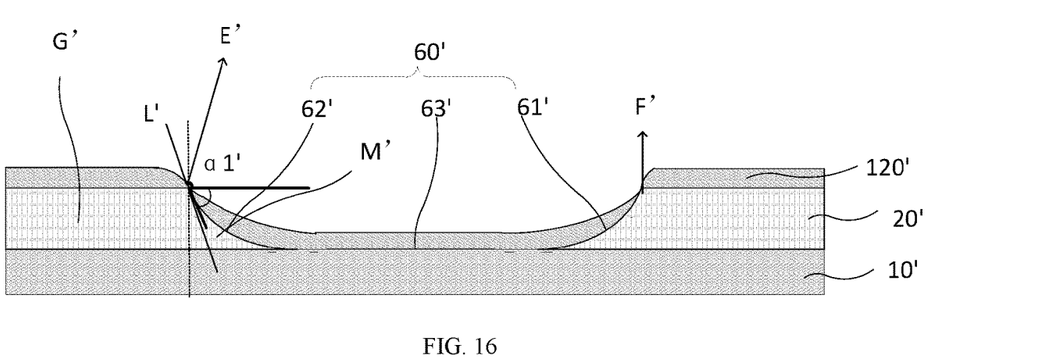
FIG. 16 is a structural schematic diagram showing a cross-section of a bending portion of a flexible display device according to a comparative example.

Please refer to FIG. 16, where FIG. 16 is a structural schematic diagram showing a cross-section of a bending portion of a flexible display device according to a comparative example (schematically, the cross-sectional view in FIG. 16 only shows partial film layers). Reference sign 20' in FIG. 16 refers to the insulation layer, 120' refers to the wirings. The insulation layer 20' in FIG. 16 includes a notch 60', the notch 60' includes inclined side walls 61' and 62', the inclined side walls 61' and 62' each have a convex shape facing toward the substrate (i.e., a concave shape facing away from the flexible substrate). The remaining portion of insulation layer 20' rather than the notch 60' can be a flat portion, such as a flat portion G'. Taking the inclined side wall 62' as an example, the notch 60' has two endpoints E' and F' close to the flat portion. For the endpoint E', in FIG. 16, it can be seen that the inclined side wall 62' where the endpoint E' is located is divided into two parts by the tangent line L' at the endpoint E', a part M' of the inclined side wall 62' and the flat portion G' are located at different sides of the tangent line L'. The inclined side walls 61', 62' each have a convex shape facing toward the substrate, so that the included angle (α1' shown in FIG. 4) between the tangent line at the endpoint of the notch 60' close to the flat portion and the plane in which the flexible substrate is located is great (greater than 40°), thus the wirings 120' have shape corners at the endpoint E' and the endpoint F' at the notch, which may easily cause short circuit or open circuit of the shape corners of the wirings at the endpoint E' and the endpoint F'. Especially, cracking may occur during bending, therefore, and signal transmission of the wirings may be affected.

Optionally, please refer to FIG. 14 and FIG. 15, where the inclined side wall 611 can include a first side wall 61 and a second side wall 62 which are spaced from each other, the bottom surface 63 of the at least one notch 60 is provided between the first side wall 61 and the second side wall 62. In a direction away from the bottom surface 63, an included angle between a tangent line at the surface of the first side wall 61 and the plane in which the flexible substrate 10 is located gradually decreases, and an included angle between a tangent line at the surface of the second side wall 62 and the plane in which the flexible substrate 10 is located is gradually decreasing as well. In FIG. 15, endpoint B, endpoint Q and endpoint F are included in this order along a direction away from the bottom surface 63. An included angle between tangent line b and the plane in which the substrate is located, an included angle between tangent line q and the plane in which the substrate is located, and an included angle between tangent line f and the plane in which the substrate is located decrease in this order. Optionally, the included angle between the tangent line f at endpoint F and the plane in which the flexible substrate is located is less than or equal to 40°. In an embodiment, the insulation layer 20 can be prepared by a manner of chemical vapor deposition, that is, providing a mask above the notch 60, generating shadow effect at the periphery area of the mask, so that the a part of the insulation layer is deposited at the area where the notch 60 is located, therefore the included angle between the tangent line at the endpoint of the notch 60 of the insulation layer 20 adjacent to the flat portion and the plane in which the flexible substrate is located is less than or equal to 40°. Such a manner is different from the manner of etching the insulation layer using an etching paste to form the notch, as shown in FIG. 16, where the inclined side wall 62' where the endpoint E' of the notch formed by using an etching past is located is divided by the tangent line L' at E' into two parts. A part M' of the inclined side wall 62' is located at a different side of the tangent line L' from the flat portion G'. The inclined side wall 61', 62' each have a convex shape facing toward the substrate, so that the included angle between the tangent line at the endpoint of the notch 60' close to the flat portion and the plane in which the flexible substrate is located is large and is greater than 40°. Adopting the manner of etching paste to prepare the notch will generate sharp corner or steep slope at the endpoints, thus the wirings 120 may suffer short circuit or open circuit at the steep slope. In some other embodiments, the included angle between the tangent line f at the endpoint F and the plane in which the flexible substrate is located is 0°, thus the insulation layer 20 can gently transition from the flat portion H to the notch 60, without steep slopes or sharp corners, thereby providing a good arrangement of the wiring at the inclined side wall and preventing short circuit or open circuit of the wirings. Additionally, in the direction away from the bottom surface 63, the included angle between the tangent line of the surface of the first side wall 61 and the plane in which the flexible substrate 10 is located gradually decreases, and the included angle between the tangent line of the surface of the second side wall 62 and the plane in which the flexible substrate 10 is located gradually decreases as well. Therefore, the inclined side wall can have a smooth convex shape facing away from the flexible substrate, so that the bending stress is uniformly distributed on the surface of the inclined side wall, thereby preventing the stress from being concentrated at a certain point where cracking happens.

Optionally, please refer to FIG. 13, where the flexible display device can further include a driving integrated circuit 70 corresponding to the second portion Q2 of the flexible substrate 10, and the driving integrated circuit 70 is electrically connected to the plurality of wirings 120, so as to provide signals to the organic light-emitting device layer 30. Optionally, the flexible display device can further include a printed circuit board 80. The driving integrated circuit 70 divides the plurality of wirings 120 into a plurality of wirings 122 connected to the first portion Q1 and a plurality of wirings 121 electrically connected to the printed circuit board 80.

Optionally, the plurality of display pixels corresponding to the first portion Q1 is arranged on a first side of the flexible substrate 10, and the driving integrated circuit 70 corresponding to the second portion Q2 is arranged on a second side of the flexible substrate 10, that is, after bending, the driving integrated circuit 70 is arranged at a side of the flexible substrate facing away from the plurality of display pixels P.

It should be noted that, the first portion can be a display portion, the second portion can be a non-display portion, and the bending portion Q3 can be used for periphery display. For example, the bending portion Q3 can be used for displaying time, date, information etc., so as to achieve a full use of the effective portion, and thus improving the visual experience. The bending portion Q3 can also be used as a non-display portion, which is not limited here in the present disclosure.

The above contents are further detailed illustrations of the present disclosure with reference to the preferred embodiments. It shall not be interpreted that the present disclosure is limited by the preferred embodiments. For those skilled in the art, a number of simple derivations and substitutions can be made without departing from the inventive concept of the present disclosure, and these derivations and substitutions also belong to the protection scope of the present disclosure. The protection scope of the present disclosure shall be defined by the appended claims.

What is claimed is:

1. A flexible display device, comprising: a flexible substrate comprising a first portion, a second portion, and a bending portion connecting the first portion to the second portion, wherein a thickness of the flexible substrate is T;
a plurality of display pixels located at a side of the first portion of the flexible substrate;
a supporting layer located at a side of the flexible substrate facing away from the plurality of display pixels, and comprising a first supporting layer, the first portion defined to be the portion of the flexible substrate abutting the first supporting layer, and a second supporting layer corresponding to the second portion, the second portion defined to be the portion of the flexible substrate abutting the second supporting layer,
wherein a thickness of the first supporting layer is T1, a thickness of the second supporting layer is T2, and a width of the bending portion is W, a bending diameter is equal to (2T+T1+T2), wherein W≥(2T+T1+T2)(π+2)/2;
wherein the first supporting layer comprises a first protection layer an auxiliary component arranged along a direction in which the flexible substrate faces away from the plurality of display pixels and a composite material layer arranged between the first protection layer and the auxiliary component; and
the second supporting layer comprises a second protection layer in the direction in which the flexible substrate faces away from the plurality of display pixels.

2. The flexible display device according to claim 1, further comprising a support member corresponding to the bending portion.

3. The flexible display device according to claim 1, further comprising a support member corresponding to the bending portion, wherein the support member and the auxiliary component are formed integrally.

4. The flexible display device according to claim 3, wherein a cross-section of the support member has an arc shape and the second portion of the flexible substrate is bent along a surface of the support member having an arc shape.

5. The flexible display device according to claim 1, further comprising a driving integrated circuit corresponding to the second portion of the flexible substrate.

6. The flexible display device according to claim 5, wherein the plurality of display pixels corresponding to the first portion is arranged on a first side of the flexible substrate, and the driving integrated circuit corresponding to the second portion is arranged on a second side of the flexible substrate.

7. The flexible display device according to claim 1, further comprising an organic light-emitting device layer and an encapsulation layer arranged in a direction in which the flexible substrate faces away from the supporting layer, and the plurality of display pixels is located in the organic light-emitting device layer.

\* \* \* \* \*